United States Patent
Yoo et al.

(10) Patent No.: US 8,116,141 B2
(45) Date of Patent: Feb. 14, 2012

(54) METHOD ANALYZING THRESHOLD VOLTAGE DISTRIBUTION IN NONVOLATILE MEMORY

(75) Inventors: Han Woong Yoo, Seoul (KR); Seung-Hwan Song, Suwon-si (KR); Junjin Kong, Yongin-si (KR); Jaehong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 239 days.

(21) Appl. No.: 12/558,627

(22) Filed: Sep. 14, 2009

(65) Prior Publication Data
US 2010/0103731 A1    Apr. 29, 2010

(30) Foreign Application Priority Data
Oct. 27, 2008  (KR) .................. 10-2008-0105398

(51) Int. Cl.
*G11C 11/34* (2006.01)
(52) U.S. Cl. .......... 365/185.24; 365/185.02; 365/185.03
(58) Field of Classification Search ............. 365/185.02, 365/185.03, 185.24
See application file for complete search history.

(56) References Cited

U.S. PATENT DOCUMENTS

| | | | |
|---|---|---|---|
| 6,522,580 B2 | 2/2003 | Chen et al. | |
| 2007/0091677 A1 | 4/2007 | Lasser et al. | |
| 2009/0016103 A1 | 1/2009 | Kang et al. | |
| 2009/0168543 A1* | 7/2009 | Kim et al. | 365/185.29 |
| 2011/0038212 A1* | 2/2011 | Uchikawa et al. | 365/185.18 |

FOREIGN PATENT DOCUMENTS

| | | |
|---|---|---|
| JP | 09035500 A | 2/1997 |
| KR | 1020070031594 A | 3/2007 |
| KR | 1020080100750 A | 11/2008 |
| KR | 1020090005549 A | 1/2009 |
| KR | 1020090039173 A | 4/2009 |

* cited by examiner

*Primary Examiner* — Vu Le
*Assistant Examiner* — Han Yang
(74) *Attorney, Agent, or Firm* — Volentine & Whitt, PLLC

(57) ABSTRACT

A distribution analyzing method for a nonvolatile memory device having memory cells exhibiting overlapping first and second threshold voltage distributions includes; detecting a degree of overlap between the first and second threshold voltage distributions by reading data stored in the memory cells and determining read index data from the read data, and estimating a distribution characteristic for at least one of the overlapping threshold voltage distributions using the read index data.

12 Claims, 10 Drawing Sheets

Fig. 3
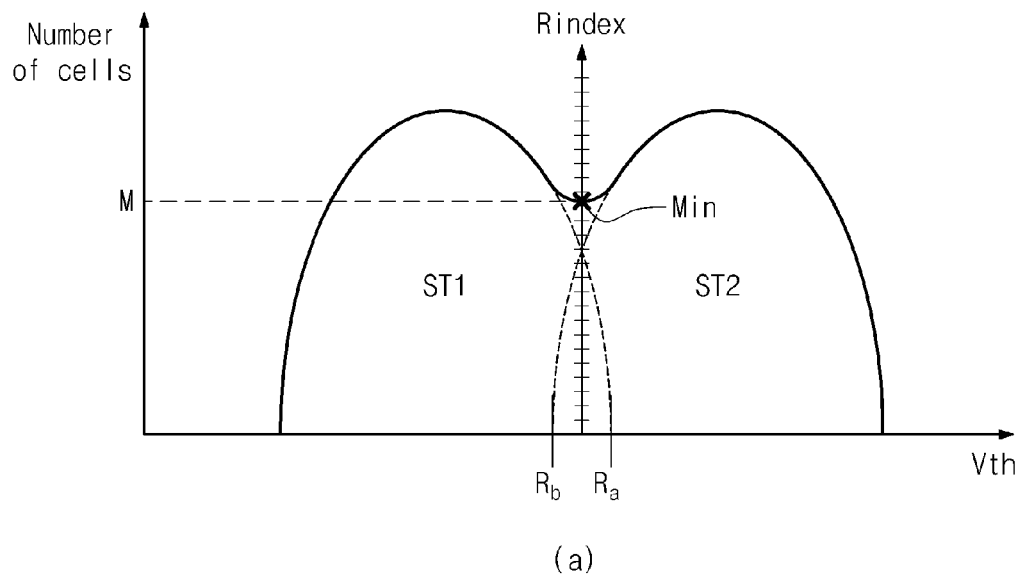
(a)
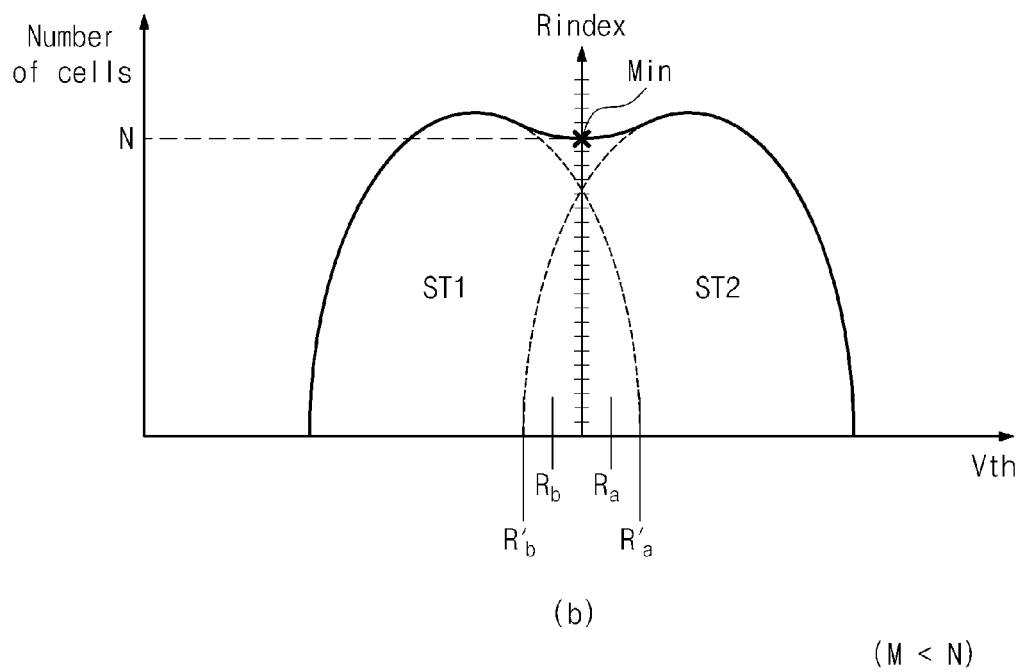
(b)
(M < N)

Fig. 9
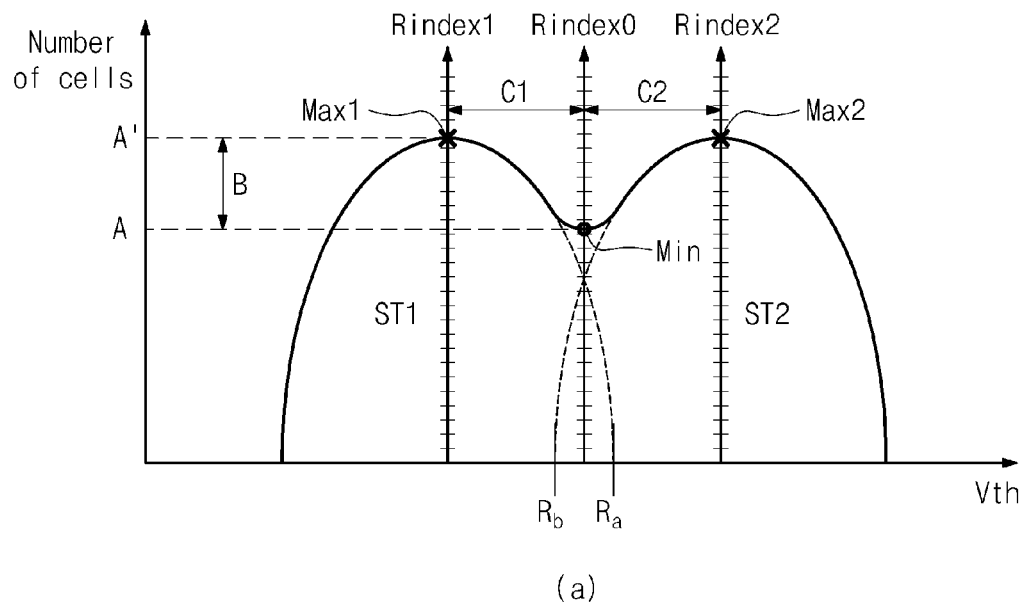
(a)
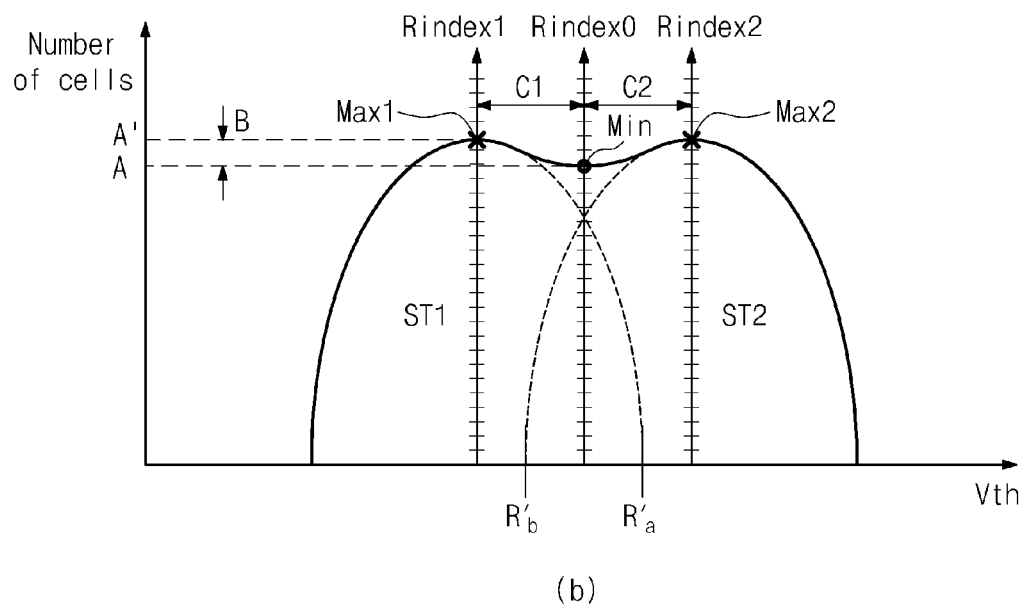
(b)

METHOD ANALYZING THRESHOLD VOLTAGE DISTRIBUTION IN NONVOLATILE MEMORY

CROSS-REFERENCE TO RELATED APPLICATION

This U.S. non-provisional patent application claims priority under 35 U.S.C. §119 to Korean Patent Application No. 10-2008-0105398, filed on Oct. 27, 2008, the subject matter of which is hereby incorporated by reference.

BACKGROUND

The present inventive concept relates to semiconductor memory devices. More particularly, the inventive concept relates to nonvolatile semiconductor memory devices and methods of analyzing the threshold voltage state of constituent memory cells.

Semiconductor memory devices may be classified as volatile and nonvolatile. A volatile semiconductor device enjoys relatively fast data access speed, but loses stored data in the absence of applied power. In contrast, a nonvolatile semiconductor memory device retains stored data even in the absence of applied power. Accordingly, nonvolatile memory devices are commonly used to store critical data that must be retained regardless of the power supply state.

Among the broader class of nonvolatile memory devices, flash memory is able to electrically erase data stored in a defined block of memory cells. As a result, flash memory is used extensively in various computer memories and memory cards. Flash memory may be further classified as NOR type or NAND type according to the connection structure between the memory cell and bit line. In NOR flash memory, more than two cell transistors are connected in parallel to one bit line. Data is stored using a Channel Hot Electron (CHE) method and data are erased using a Fowler-Nordheim (F-N) tunneling method. In NAND flash memory, more than two cell transistors are connected in series to one bit line, and data is both stored and erased using the F-N tunneling method.

Each memory cell in a flash memory stores N-bit data, where "N" is a positive integer. In flash memory cells storing single bit (binary) data, two (2) threshold voltage states are used, respectively corresponding to data values of 1 and 0. In flash memory storing two-bit data, four (4) threshold voltage states are used, respectively corresponding to data values of 00, 01, 10, and 11. This approach extends to other types of multi-bit flash memory cells storing, for example, three-bit data according to eight (8) threshold voltage states, or four-bit data according to sixteen (16) threshold voltage states.

SUMMARY

Embodiments of the inventive concept provide a method and device capable of analyzing the threshold voltage state of nonvolatile memory cells to thereby improve the performance of the constituent nonvolatile memory device.

Embodiments of the inventive concept provide a threshold voltage distribution analyzing method for nonvolatile memory devices. The method includes; detecting an overlapping degree by accessing a plurality of memory cells having overlapping threshold voltage distributions, and then estimating an original form for the threshold voltage distributions according to the detected degree of overlap.

In one aspect, embodiments of the inventive concept provide a distribution analyzing method for a nonvolatile memory device having memory cells exhibiting overlapping first and second threshold voltage distributions, the method comprising; detecting a degree of overlap between the first and second threshold voltage distributions by reading data stored in the memory cells and determining read index data from the read data, and estimating a distribution characteristic for at least one of the overlapping threshold voltage distributions using the read index data.

In another aspect, embodiments of the inventive concept provide a memory system comprising; a nonvolatile memory device, and a memory controller controlling the nonvolatile memory device. The memory controller controls the nonvolatile memory device using the foregoing analyzing method.

BRIEF DESCRIPTION OF THE DRAWINGS

Embodiments of the inventive concept will be described with reference to the accompanying drawings. In the drawings:

FIG. 3 is a conceptual threshold voltage distribution diagram illustrating an embodiment of the inventive concept;

FIG. 9 is a conceptual threshold voltage distribution diagram illustrating an another embodiment of the inventive concept.

DETAILED DESCRIPTION OF EMBODIMENTS

Embodiments of the inventive concept will be described in some additional detail with reference to the accompanying drawings. However, it should be noted that the inventive concept may be variously embodied and should not be construed as being limited to only the illustrated embodiments. Rather, the illustrated embodiments are presented as teaching examples. Throughout the drawings and the written description, like reference numbers and labels are used to denote like or similar elements and features.

In the exemplary embodiments described hereafter, NAND flash memory is used as a working example of nonvolatile memory devices. However, those skilled in the art will recognize that other types of nonvolatile memory may incorporate the teachings of the inventive concept which is not limited to only NAND flash memory.

The term "distribution" will be used within the following description to mean a number of memory cells corresponding to a memory cell threshold voltage within a specific unit (e.g., a page, a block, or a chip).

Figure 1:
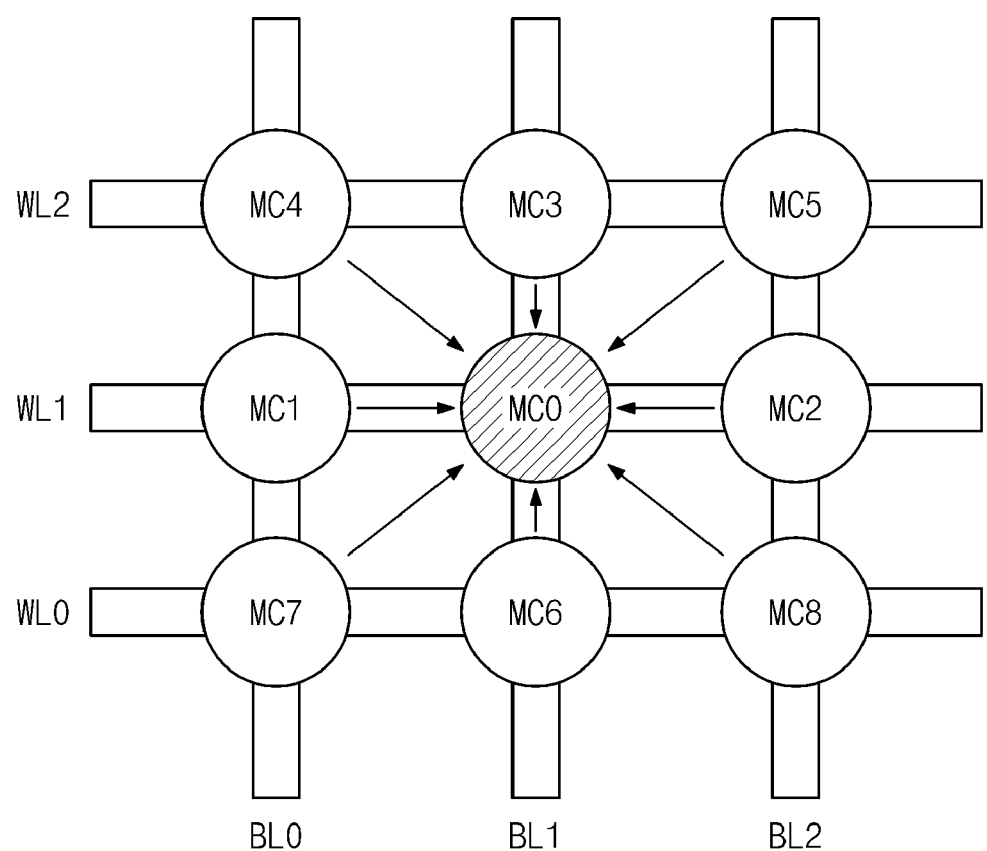
FIG. 1 is a conceptual illustration of a memory cell array within a nonvolatile memory.

FIG. 1 is a conceptual diagram illustrating a portion of a memory cell array 100 in a nonvolatile memory according to an embodiment of the inventive concept. Referring to FIG. 1, a target memory cell may be affected by "peripheral" memory cells (i.e., memory cells adjacent or proximate to the particular memory cell) during a program operation. Certain peripheral memory cells may be viewed as "aggressor cells", since they tend to couple voltage onto the target memory cell, thereby affecting its threshold voltage state. In the case illustrated in FIG. 1, any one or more of peripheral memory cells MC1 through MC8 may act as an aggressor memory cell by undesirably coupling energy (voltage or current) onto the target victim cell MC0. The net effect of the peripheral memory cells MC1 though MC8 on the target memory cell MC0 may shift its threshold voltage.

One representative mechanism whereby peripheral memory cells affect a target memory cell is the so-called coupling effect. The coupling effect can actually shift the threshold voltage of the target memory cell from an "initial" (i.e., initially programmed) threshold voltage to some other threshold voltage level. There are other mechanisms whereby peripheral memory cells may affect the threshold voltage distribution of a target memory cell, but the coupling effect is an excellent example. The so-called "program disturb" phenomenon is another well understood mechanism whereby the threshold voltage of a target memory cell MC0 may be shifted during the programming of one or more peripheral memory cells. The size, physical layout and cell proximity, respective voltage level(s), and programming techniques used may all contribute to shift a threshold voltage of the target memory cell MC0 in relation to the peripheral cells MC1 through MC8. For example, the target memory cell MC0 may receive a dominant coupling effect from the aggressor memory cell MC3 due to a program voltage provided via the word line W2 during a program operation. Alternately or additionally, the fact that adjacent memory cells MC3 and MC6 are commonly connected to the bit line BL1, or the fact that adjacent memory cells MC1 and MC2 are commonly connected to the word line WL1 with the target memory cell MC0 is often enough to hazard the threshold voltage of the target memory cell MC0. In another example, the threshold voltage of the target memory cell MC0 may be shifted (i.e., reduced to a lower level) due to insulation deterioration of an oxide layer over time, Hot Temperature Stress (HTS), and/or a high number of applied program/erase (P/E) cycles.

However, the threshold voltage shifting addressed by embodiments of the inventive concept is not limited to a particular type of operation or mechanism. Regardless of actual mechanism(s) at work, the threshold voltage of a target memory cell may be shifted and such shifting may errantly alter the value of data stored in the target memory cell. Accordingly, during a subsequent read operation to the target memory cell, distributions of two adjacent threshold voltages may overlap due to an erosion of read margin caused by threshold voltage shifting. In such a case, one or more bit errors may arise in the read data.

However, an analyzing method according to embodiments of the inventive concept allows overlapping threshold voltage distributions to be properly discriminated (i.e., separated and distinguished one from another). That is, overlapping threshold voltage distributions may be separated and each separated threshold distribution may then be estimated, (e.g., a lower limit voltage, an upper limit voltage, and an error rate of distribution may be estimated). Additionally, according to analyzing methods of the inventive concept, overlapping threshold voltage distributions may be separated into a plurality of sub-distributions in order to develop estimates based on coupling effects and/or program disturbs. Using the separated threshold distributions, memory cells experiencing the same or similar coupling and/or program disturb effects due to one or more peripheral cells may be selected and accessed. Consistent with an analyzing method according to an embodiment of the invention, a read voltage corresponding to various requirements may be provided. That is, a read voltage may be defined to provide a specified reliability and DC parameters associated with the amount of coupling effects influencing a read cell may also be provided.

Figure 2:
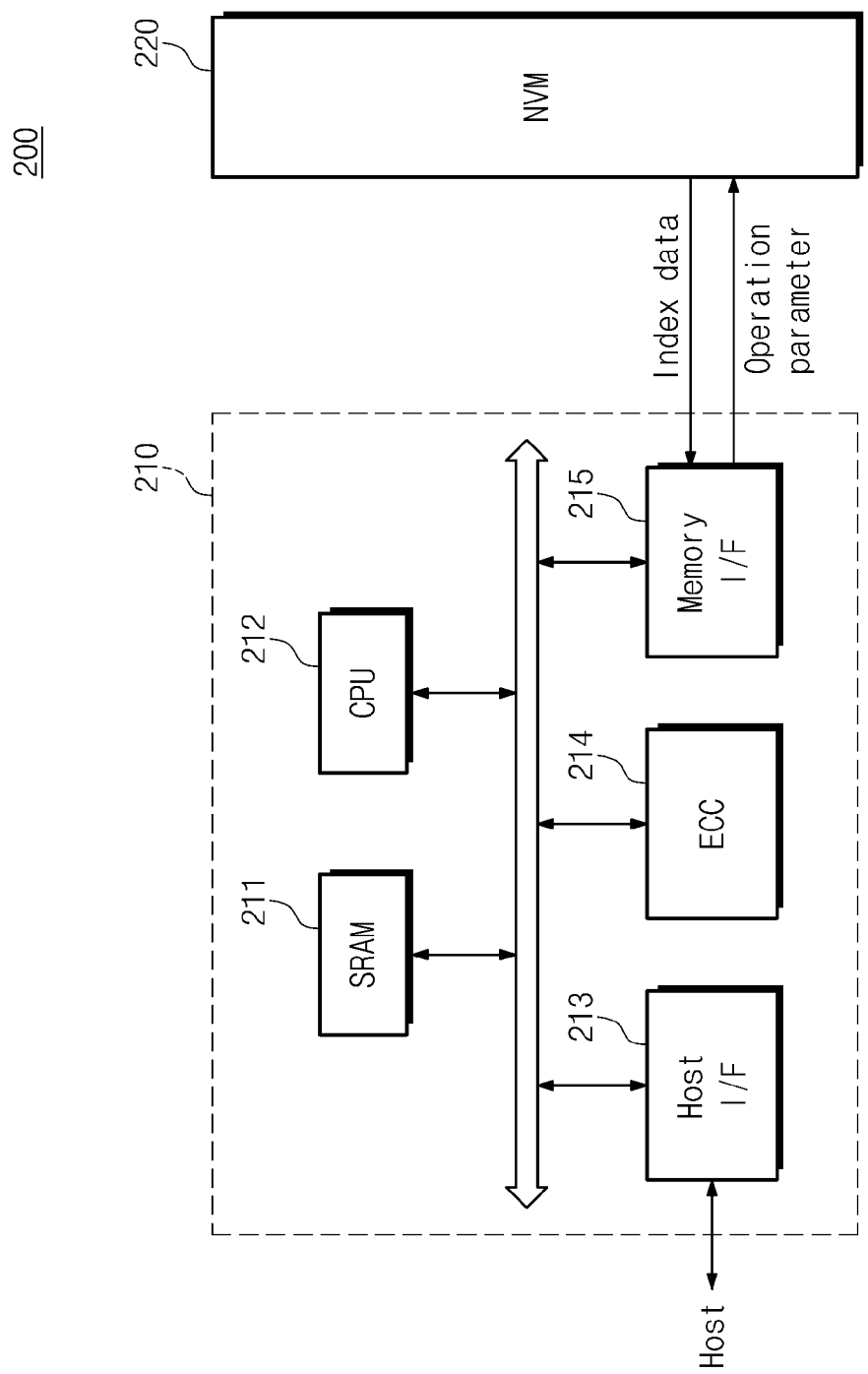
FIG. 2 is a block diagram illustrating a memory system.

FIG. 2 is a block diagram illustrating a memory system 200. Referring to FIG. 2, the memory system 200 includes a nonvolatile memory device 220 and a memory controller 210.

The nonvolatile memory device 220 may by constituted using a flash memory device having the cell array 100 of FIG. 1. The memory controller 210 generally controls the nonvolatile memory device 220. The combination of the nonvolatile memory device 220 and the memory controller 210 may be provided as a memory card or a Solid State Disk (SSD). In the illustrated embodiment, a SRAM 211 is used as an operation memory associated with a central processing unit (CPU) 212. A host interface (I/F) 213 includes a data exchange protocol of a host connected to the memory system 200. An error correction block (ECC) 214 detects and corrects an error in data read from the nonvolatile memory device 220. The memory interface (I/F) 214 interfaces with the nonvolatile memory device 220 of the present inventive concept. The CPU 212 performs general control operations for data exchange of the memory controller 210. Although not illustrated in the drawings, it is apparent to those skilled in the art that the memory system 200 may further include a ROM (not shown) for storing code data interfacing with a host. The nonvolatile memory device 220 may be provided as a multi-chip package including a plurality of flash memory chips. The memory system 200 may be provided as a highly reliable storage medium having a low error occurrence rate. Especially, the flash memory device of the inventive concept may be equipped in a memory system such as a SSD, which is actively under development. In this case, the memory controller 210 is configured to communicate with an external (for example, a host) through one of various interface protocols such as USB, MMC, PCI-E, SATA, PATA, SCSI, ESDI, and IDE.

In the foregoing system configuration, for example, the memory controller 210 may be used to estimate one or more characteristics (e.g., a threshold distribution shape) for each overlapping threshold voltage distribution using various reference indicators. Such reference indicators may include, for example, index data derived by accessing the nonvolatile memory device 220. That is, the memory controller 210 may obtain data indicating a number of memory cells programmed to a particular threshold voltage in two overlapping distributions from such index data. In relation to this number of memory cells having a particular threshold voltage (or a number of memory cells programmed within a defined threshold voltage range), the memory controller 210 may estimate general characteristics of the overlapping threshold voltage distributions. Even if it is difficult to separate overlapping threshold voltage distributions for memory cells, some threshold voltage distribution shape (or "form") for an overlapping threshold voltage in a particular range may be restored. Additionally, by referring to the restored threshold voltage distribution shape, a ratio of memory cells included in each threshold voltage distribution may be obtained in an overlapping threshold voltage region. Additionally, each overlapping threshold voltage distribution may be separated into a plurality of sub-distributions according to an estimated amount of coupling effect using corresponding index data. The certain threshold voltage shift parameters may be defined by analyzing the amount (or degree) of coupling effects. If separated sub-distributions are used, information supporting a subsequent read operation having higher resolution (e.g., a read voltage level varied according to the amount coupling) may be generated.

Here, the shift parameters may include a parameter indicating "coupling effect size", or a number of peripheral cells and their respective program state. Moreover, in order to more accurately estimate threshold voltage shifting for a target cell, additional coupling effect information may be provided on a chip unit, a block unit, or page unit basis. Further, certain process parameters, program disturb, data retention, number of previously executed program and erase (P/E) cycles, and/or other characteristics obtained from (e.g.,) a pilot cell may also be provided as shift parameter(s). In one embodiment of the inventive concept, index data includes data indicating a number of memory cells having a specific threshold voltage, a number of the minimum dispersion points, a number of the maximum dispersion points, a threshold voltage difference between the minimum dispersion point and the maximum dispersion point, and/or a ratio between the number of the minimum dispersion points and maximum dispersion points. Hereinafter, the minimum dispersion point will be termed "a minimum point" and the maximum dispersion point will be termed "a maximum point".

The memory controller 210 is able to restore the proper form of overlapping threshold voltage distribution using index data obtained from the nonvolatile memory device 220. For example, an upper limit threshold voltage or a lower limit threshold voltage for each threshold voltage distribution—otherwise obscured by the overlapping of two threshold voltages—may be restored. According to this restoration process, the proper level for a corresponding voltage read may be defined in order to enhance read data reliability (i.e., "an optimized read voltage").

Furthermore, the memory controller 210 is able to separate a threshold voltage distribution into a plurality of sub-distributions in relation to relevant coupling effects through a calculation process or table mapping look-up process using index data and/or shift parameter(s). For example, the memory controller 210 may estimate the level of an optimized read voltage in relation to a coupling effect size and then provide the optimized read voltage to the nonvolatile memory device 220. Thus, in certain embodiments of the inventive concept, the memory controller 210 includes a look-up table storing threshold voltage distribution characteristics obtained by empirical testing. Using these characteristics, the plurality of sub-distributions may be defined in relation to (e.g.) a given coupling effect size.

In this manner, the memory controller 210 is able to identify certain characteristics (or influences on a threshold voltage characteristic) corresponding to provided index data, and then use such characteristics to define the distribution characteristics for one or more selected memory cells. All this may be done in a general control context wherein the memory controller 210 controls the operation of the nonvolatile memory device 220 using read voltage(s) that ensure data reliability consistent with the error correction/detection capabilities provided by the error correction block 214.

Using the foregoing and similar techniques, the memory controller 210 is able to estimate and/or restore the separate forms for overlapping threshold voltage distributions using what will be generally be termed hereafter "read index data" obtained from the nonvolatile memory device 220. The various examples of shift parameter(s) and index data noted above are exemplary of data that may be effectively combined and used as read index data to estimate a threshold voltage distribution for memory cells having a given coupling effect size.

Once estimation of a threshold voltage distribution for such memory cells is completed, various derived data can be generated using the estimated threshold voltage distribution. That is, certain operating parameters may be defined, such as the DC levels of memory cells in the nonvolatile memory device 220, one or more optimized read voltage(s), and/or a defined read voltage reliability. The reliability and performance of the nonvolatile memory device 220 may be improved using the computational and related data storage capabilities of the CPU 212, SRAM 211, and ECC 214 within the exemplary memory controller 210. The derived operating parameters for the memory cells of the nonvolatile memory device 220 may also be provide to external devices such as a host controller associated with the memory system 200.

Thus, the original (or near original) form of each overlapping threshold voltage distribution may be estimated using read index data. Then, based on the estimated threshold voltage certain operating parameters may be calculated (or looked up in a table) to enhance the read data reliability of the memory controller 210. This approach of estimating threshold voltage distribution and then defining operating parameters using read index data may be used in conjunction with any type of nonvolatile memory device, including so-called fusion memory devices (e.g., one NAND flash memory).

FIG. 3 is a set of diagrams conceptually illustrating an embodiment of the inventive concept. Referring to the diagrams of FIG. 3, a minimum point exists in an overlapping region of two threshold voltage distributions ST1 and ST2. Referring to the number of memory cells corresponding to the minimum point (hereinafter, referred to as the "minimum value"), a complete form of each overlapping threshold voltage distribution may be estimated. That is, the general characteristics of the threshold voltage distribution for memory cells may be estimated using read index data including the minimum value. A more detailed description of this estimation process follows. It should be noted that the diagrams of FIG. 3(a) and FIG. 3(b) illustrate threshold voltage distributions ST1 and ST2 that overlap with different ratios.

Referring to FIG. 3(a), the threshold voltage distributions ST1 and ST2 overlap due to various factors. It is difficult to determine whether memory cells having a threshold voltage (Vth) within the overlapping threshold voltage range (e.g., $Rb \leq Vth \leq Ra$) should be included in one or the other of the two threshold voltage distributions. However, according to an analyzing method consistent with an embodiment of the inventive concept, a number of memory cells "M" corresponding to the minimum voltage detected for the minimum point (e.g., "Rindex") may be determined for the overlapping threshold voltage range. Then, with this data indicating a number of memory cells corresponding to the detected minimum point voltage Rindex, it is possible to estimate the general characteristics of each overlapping threshold voltage distribution ST1 and ST2. That is, the size of the overlapping region may be determined as a function of the number of memory cells M corresponding to the minimum voltage Rindex, and this relationship may be used to ensure the read reliability for memory cells having a threshold voltage within the overlapping threshold voltage range (i.e., in relation to relevant data obtained via empirical testing or theoretical calculations). Accordingly, an upper limit threshold voltage level "Ra" for the first threshold voltage distribution ST1 and a lower limit threshold voltage level "Rb" for the second threshold voltage distribution ST2 may be effectively estimated.

Referring to FIG. 3(b), the first and second threshold voltage distributions ST1 and ST2 overlap to an even greater extent, as compared with the example illustrated in FIG. 3(a). Thus, it is more difficult to externally determine whether memory cells having a threshold voltage (Vth) within the overlapping threshold voltage range (Rb'≦Vth≦Ra') should be included in one or the other of the overlapping threshold voltage distributions. However, using the foregoing analyzing method according to an embodiment of the inventive concept, a minimum point voltage Rindex is detected within the overlapping threshold voltage range. Then, a number of memory cells "N" corresponding to the minimum point voltage Rindex may be determined. Using this data, it is possible to estimate the general characteristics for each of the first and second threshold voltage distributions ST1 and ST2. As above, an upper limit threshold voltage level "R'a" for the first threshold voltage distribution ST1 and a lower limit threshold voltage level "R'b" for the second threshold voltage distribution ST2 may be effectively estimated.

Additionally, once the degree of overlap between the first and second threshold voltage distributions is estimated, the probable read error rate for any arbitrary read voltage may be calculated. That is, given a particular read voltage (e.g., the upper limit threshold voltage Ra shown in FIG. 3(b), a corresponding error rate may be calculated in view of the estimated threshold voltage distributions and a ratio of memory cells properly considered within the first threshold voltage distribution ST1 or within the second threshold voltage distribution ST2. A predictive error rate calculation may be similarly made for the lower limit threshold voltage (e.g., Rb in FIG. 3(b)).

As noted above, the degree of overlap between the first and second threshold voltage distributions shown in FIG. 3(b) is greater than that between the first and second threshold voltage distributions shown in FIG. 3(a). In this regard, the difference in "overlapping degree" between two threshold voltage distributions may be predicted in relation to a corresponding number of memory cells associated with the detected minimum point value Rindex (i.e., "minimum memory cell numbers" M or N). As a result, the minimum memory cell number (M or N) may be used as read index data in certain embodiments of the inventive concept.

In order to estimate the form of each overlapping threshold voltage distribution using read index data, it is typically necessary to assume that each threshold voltage distribution has (or should have) a similar form. However, even if overlapping threshold voltage distributions are asymmetric, the above approach may be used without great difficulty, so long as relevant distribution characteristics, such as minimum memory cell number(s) for each program state and model threshold voltage distributions can be obtained through testing or calculation. Those skilled in the art will be familiar with conventional techniques for threshold voltage modeling, empirical testing of pilot memory cell arrays, etc.

Referring to the above embodiments, general distribution characteristics may be estimated by obtaining of read index data (e.g., a minimum memory cell number). Additionally, once the read index data is obtained, the form of an overlapping threshold voltage distribution may be defined, such that a read operation yields an acceptable read data accuracy. That is, referring to FIGS. 2 and 3, when read data of a read level having a specific reliability is being requested from the error correction block 214 or an external host, data can be read with a corresponding read level by referring to the obtained distribution characteristic and provided. For example, if read data must be provided with a read level of 70% reliability in response to a request form of an error correction/detection algorithm being executed by the ECC 214, read data may be so provided using upper and lower limit read voltage Ra1 and Rb1 defined according to the distribution characteristics.

Figure 4:
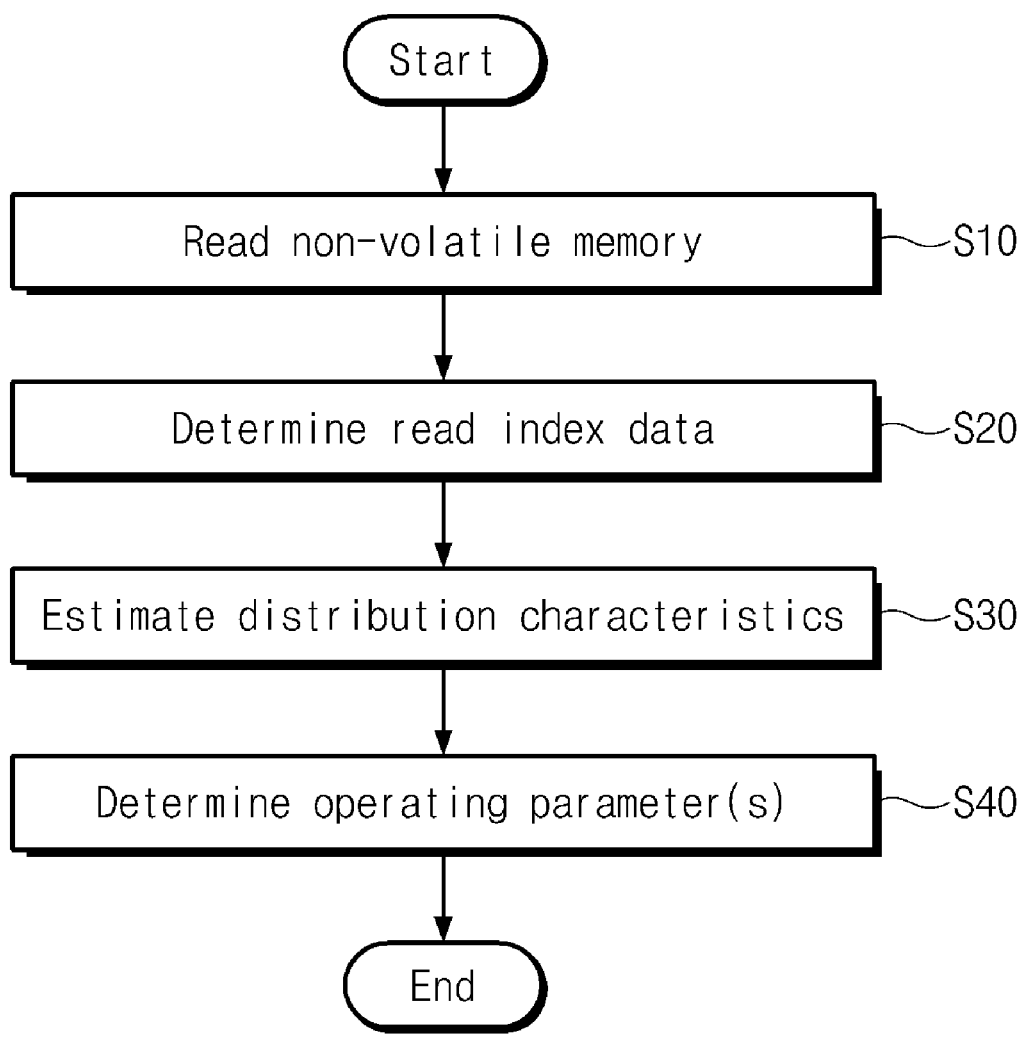
FIG. 4 is a flowchart summarizing a threshold voltage distribution analyzing method according to an embodiment of the inventive concept.

FIG. 4 is a flowchart summarizing a distribution analyzing method according to an embodiment of the inventive concept. First, data is read from the nonvolatile memory device 220 using a conventional read operation. In order to obtain read data sufficient to properly detect a minimum point voltage, and obtain a minimum memory cell number corresponding to the minimum point voltage, the read operation may be performed multiple times while varying the constituent read voltage within a specified range (S10).

Using the obtained read data, read index data is next determined (S20). As explained above, the particular nature of the read index data may vary with implementation and design. However, in certain embodiments of the inventive concept, a minimum memory cell number corresponding to a minimum point voltage is used as read index data.

Next, the characteristics (e.g., the form) of each overlapping threshold voltage distribution are estimated using the read index data (S30). For example, a lower limit threshold voltage Ra and/or an upper limit threshold voltage Rb for each threshold voltage distribution may be estimated according to the read index data, and in view of a required read data reliability requirement. Threshold voltage distribution characteristic estimation may be performed by means of an estimation algorithm using various parameters or a look-up table.

By considering real-time read data and related read index data, the characteristic(s) of each threshold voltage distribution (and corresponding operating parameters) may be derived in specific relation to the memory cells within the nonvolatile memory device 220.

Having effectively estimated distribution characteristics, certain operating parameters may be determined (S40). These operating parameters may subsequently be used to modify read operations directed to the nonvolatile memory device 220 (e.g., certain default read operation parameters may be adjusted or corrected, such as DC level, driving frequency, etc.).

Referring to the foregoing, another method of analyzing characteristics of overlapping threshold voltage distributions for memory cells within a nonvolatile memory will be described in relation to an embodiment of the inventive concept. Here again, the method of analyzing yields real-time operating parameters that are optimized for read operations applied to the nonvolatile memory device 220 in relation to its actual operating environment. In the embodiment described in relation to FIG. 3, the form of each overlapping first and second threshold voltage distribution ST1 an ST2 was restored using read index data related to a minimum point voltage Rindex. However, threshold voltage distributions may be divided by other embodiments of the inventive concept in relation to a shift effect upon the threshold voltage distribution caused by coupling or program disturb effects. In the embodiment of the inventive concept described below, reference is made to coupling and/or the program disturb effects in dividing one or more threshold voltage distributions into a plurality of sub-distributions.

Figure 5:
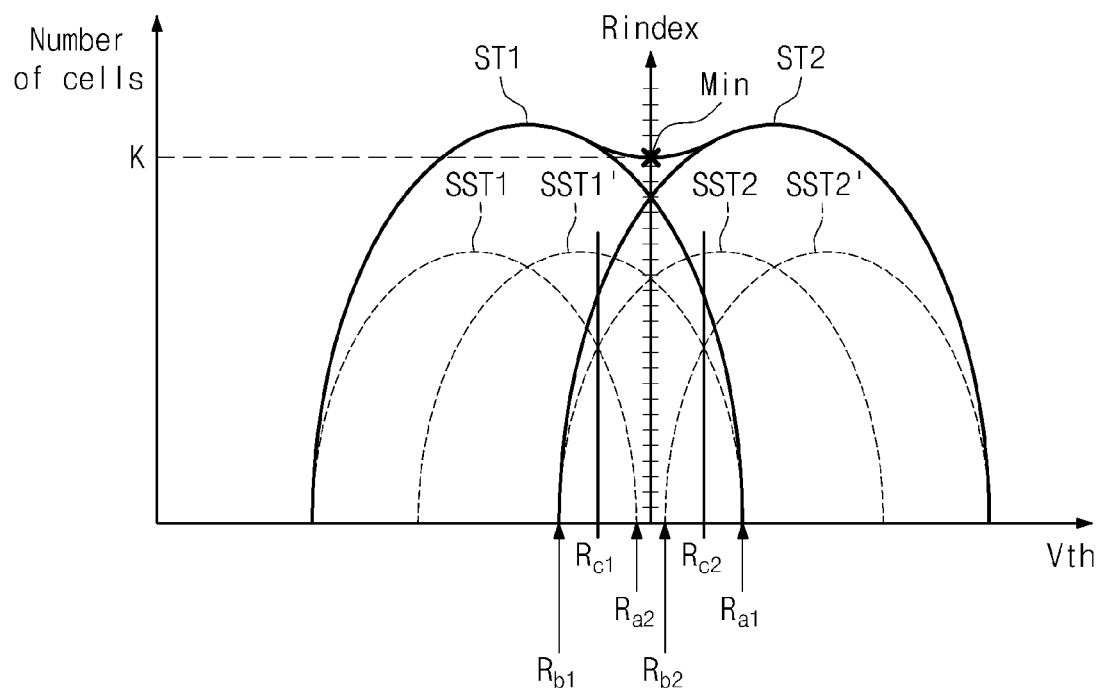
FIG. 5 is a conceptual threshold voltage distribution diagram illustrating an another embodiment of the inventive concept.

FIG. 5 is a diagram illustrating another embodiment of the inventive concept. Referring to FIG. 5, overlapping first and second threshold voltage distributions ST1 and ST2 are respectively divided into a plurality of sub-distributions SST1, SST1', SST2, and SST2' by analyzing coupling effects indicated by read index data. That is, each of the first and second threshold voltage distributions ST1 and ST2 includes one group of memory cells having a threshold voltage shifted due to some coupling effect and another group of memory cells having a threshold voltage that is not significantly shifted by the coupling effect. Accordingly, if a data read operation may be analyzed in relation to the coupling effect, its constituent operating parameters may be modified to improve read reliability. In the illustrated embodiment, the well understood adjacent cell coupling effect will used as an example of many other factors (e.g., the program disturb) capable of selectively shifting the threshold voltage of certain memory cells within a nonvolatile memory device.

Referring to FIG. 5, adjacent first and second threshold voltage distributions ST1 and ST2 overlap across a threshold voltage interval, $Rb1 \leq Vth \leq Ra1$. Accordingly, it is difficult to determine whether memory cells having a threshold voltage (Vth) in the overlapping threshold voltage range $Rb1 \leq Vth \leq Ra1$ should be included in one or the other distribution. In the illustrated embodiment of the inventive concept, each one of the overlapping first and second threshold voltage distributions ST1 and ST2 is divided into a plurality of sub-distributions, wherein one of the sub-distributions contains memory cells that are not affected (or are less affected) by the coupling effects shifting one or both of the first and second threshold voltage distributions, and the other one of the sub-distributions contains memory cells that are affected (or are more affected) by the coupling effects.

For example, the first threshold voltage distribution ST1 is divided into a first sub-distribution SST1 of memory cells that are not affected (or are less affected) by the coupling effects, and a second sub-distribution SST1' of memory cells that are affected (or more affected) by the coupling effects. Factors other than relative coupling effect influence may be used to divide a threshold voltage distribution into multiple (two or more) sub-distributions in other embodiments of the inventive concept.

In order to distinguish the first and second sub-distributions SST1 and SST1', the memory controller 210 must recognize the program state of the peripheral (aggressor) memory cells producing the coupling effect on target memory cell(s). That is, based on the program state of the peripheral memory cells proximate to a target memory cell, a determination is made as to whether or not the target memory cell will be included within a particular sub-distribution. Using this approach, certain memory cells suffering little or no influence from the coupling effect (i.e., memory cells placed into the second sub-distribution SST2) may be identified and grouped effect, and an optimized read voltage for these memory cells may be used during subsequent read operations. The same is true for memory cells suffering more from the influence of the coupling effect (i.e., memory cells placed into the first sub-distribution SST1). In essence, the actual influence of the coupling effect produced by peripheral memory cells on a target memory cell becomes a "characteristic" defining which sub-distribution for the target memory cell. Accordingly, once the respective distribution characteristics for the first and second sub-distributions SST1 and SST2 are obtained, an upper limit threshold voltage Ra2 and a lower limit threshold voltage Rb1 for each sub-distribution may be defined. Additionally, a first read threshold voltage Rc1 corresponding to a sub-distribution minimum point voltage within an overlapping interval range between the respective first sub-distributions SST1 and SST2 can be determined. The first read threshold voltage Rc1 may be used as a read voltage distinguishing between the respective first sub-distributions SST1 and SST2.

Additionally, once the respective distribution characteristics for the respective second sub-distributions SST1' and SST2', each including memory cells that are more highly influenced by the coupling effect, are obtained, optimized read voltage(s) for the memory cells may be provided during subsequent read operations. That is, once distribution characteristics of the respective second sub-distributions SST1' and SST2' are obtained, an upper limit threshold voltage Ra1 and a lower limit threshold voltage Rb2 for each second sub-distribution can be defined.

The characteristics (e.g., the form) of each second sub-distribution SST1' and SST2' considering the coupling effects may be estimated using a minimum memory cell number determined in relation to the overlapping region between the first and second threshold voltage distributions ST1 and ST2. Additionally, a second threshold read voltage Rc2 corresponding to a minimum point voltage at the overlapping interval of the second sub-distributions SST1' and SST2' can be defined. The second threshold read threshold voltage Rc2 may used to distinguish between memory cells included in each respective second sub-distribution SST1' and SST2'.

Consequently in the embodiment conceptually illustrated in FIG. 5, the characteristics of general threshold voltage distributions may be obtained by determining a minimum memory cell number "K" corresponding to a minimum point voltage Rindex. That is, distribution characteristics including upper limit and lower limit threshold voltages for each threshold voltage distribution ST1 and ST2 corresponding to the minimum memory cell number K, as well as upper limit and lower limit threshold read voltages for respective first and second the sub-distributions SST1, SST1', SST2, and SST2' may be obtained.

Figure 6:
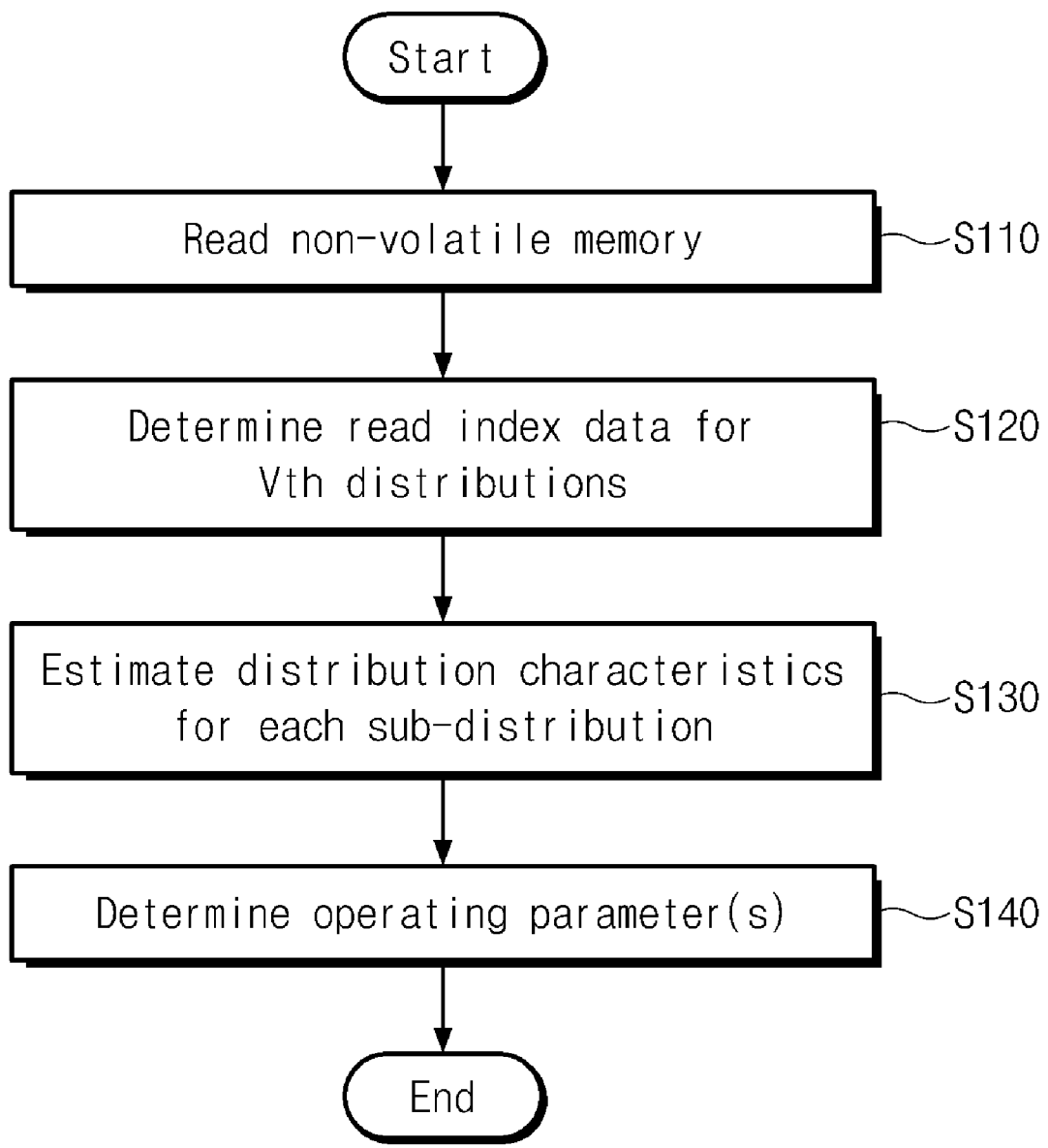
FIG. 6 is a flowchart summarizing a threshold voltage distribution analyzing method according to an embodiment of the inventive concept.

FIG. 6 is a flowchart illustrating a distribution analyzing method according to another embodiment of the inventive concept. Like the method previously described in relation to FIG. 4, the method summarized in FIG. 6 is capable of determining characteristics for overlapping threshold voltage distributions using read index data.

As before, data is first read from the nonvolatile memory device 220 using a conventional read operation. In order to obtain read data sufficient to properly detect a minimum point voltage, and obtain a minimum memory cell number corresponding to the minimum point voltage, the read operation may be performed multiple times while varying the constituent read voltage within a specified range (S110).

Using the obtained read data, read index data is next determined (S120). As explained above, the particular nature of the read index data may vary with implementation and design. However, in certain embodiments of the inventive concept, a minimum memory cell number corresponding to a minimum point voltage is used as read index data.

Next, the characteristics (e.g., the form) of each overlapping threshold voltage distribution and sub-distribution are estimated using the read index data (S130). For example, a lower limit threshold voltage and/or an upper limit threshold voltage for each threshold voltage distribution and each sub-distribution may be estimated according to the read index data, and in view of a required read data reliability requirement. Threshold voltage distribution characteristic estimation may be performed by means of an estimation algorithm using various parameters or a look-up table.

By considering real-time read data and related read index data, the characteristic(s) of each threshold voltage distribution (and corresponding operating parameters) as well as each sub-distribution (and corresponding operating parameters) may be derived in specific relation to the memory cells within the nonvolatile memory device 220.

Having effectively estimated distribution characteristics and sub-distribution characteristics, certain operating parameters may be determined (S140). These operating parameters may subsequently be used to modify read operations directed to the nonvolatile memory device 220 (e.g., certain default read operation parameters may be adjusted or corrected, such as DC level, driving frequency, etc.).

Figure 7:
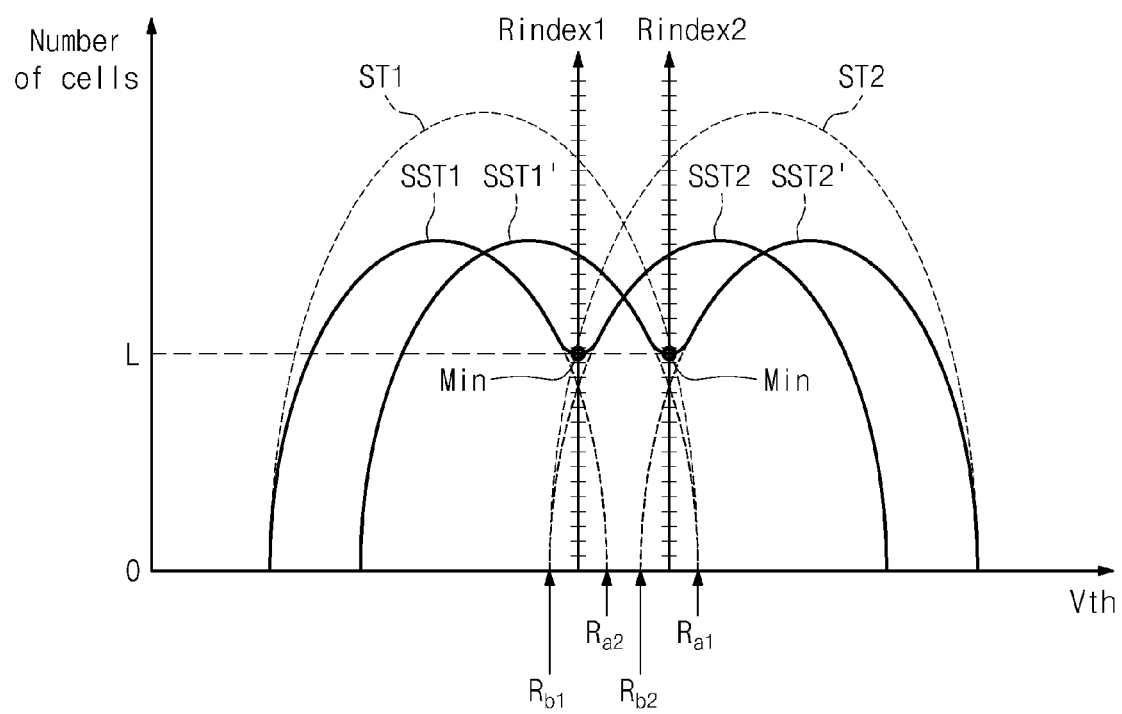
FIG. 7 is a conceptual threshold voltage distribution diagram illustrating an another embodiment of the inventive concept.

FIG. 7 is a diagram conceptually illustrating another embodiment of the inventive concept. FIG. 7 illustrates a case where the threshold voltage shifting influence of coupling effects and program disturb are considered to distinguish respective sub-distributions. That is, memory cells are divided into sub-distributions according the relative influence of the coupling effect and/or program disturb. Here again, each sub-distribution has an overlapping region. In this case, memory cells may again be read in relation to respective first sub-distributions SST1 and SST2 and the second sub-distributions SST1' and SST2'. Read index data (i.e., a minimum memory cell number "L" is obtained by accessing memory cells corresponding to the first sub-distributions SST1 and SST2 which include memory cells influenced relatively little by the coupling effect and program disturb. Once the read index data is obtained, an upper limit threshold voltage Ra2 for the first sub-distribution SST1 of the first threshold voltage distribution ST1, or a lower limit threshold voltage Rb1 for the first sub-distribution SST2 of the second threshold voltage distribution ST2, may be obtained.

Additionally, using the read index data, an upper limit threshold voltage Ra1 for the second sub-distribution SST1' of the first threshold voltage distribution ST1, and a lower limit threshold voltage Rb2 for the second sub-distribution SST2' of the second threshold voltage distribution ST2 may be obtained. With reference to these upper and lower limit threshold voltage certain characteristics (e.g., the width) of the respective first and second sub-distributions SST1, SST2, SST1', and SST2', as well as the corresponding characteristics of the incorporating threshold voltage distributions ST1 and ST2 may be estimated. Here, under an assumption that the threshold voltage distributions are symmetric and the coupling effect is linear, the read index data (i.e., minimum memory cell number L) may be obtained by detecting one of two possible minimum point voltages (i.e., Rindex1 and Rindex2).

As mentioned above, in order to illustrate distribution characteristics of the sub-distributions SST1, SST2, SST1', and SST2' and the distributions ST1 and ST2, the lower limit threshold voltage or the upper limit threshold voltage of each distribution can be obtained. However, embodiments of the inventive concept are not limited thereto. That is, characteristics of the sub-distributions SST1, SST2, SST1', and SST2' and the distributions ST1 and ST2 may be provided as various derived data such as the number of memory cells corresponding to a specific threshold voltage and a threshold voltage corresponding to reliability. In order to distinguish the sub-distributions SST1, SST2, SST1', and SST2', a coupling effect is considered first. Accordingly, before accessing the nonvolatile memory device 220 to obtain read index data, classification of memory cells needs to be completed according to the size of coupling. That is, in order to distinguish the sub-distributions SST1 and SST1', the memory controller 210 must recognize a program state of aggressor cells that provide coupling effect around memory cells. That is, based on the program degree to which peripheral memory cells proximate a target memory cell, it is determined whether the target memory cell(s) should be included within a particular sub-distribution. Multiple read operations may be performed to obtain the read index data with respect to the determined sub-distributions.

Figure 8:
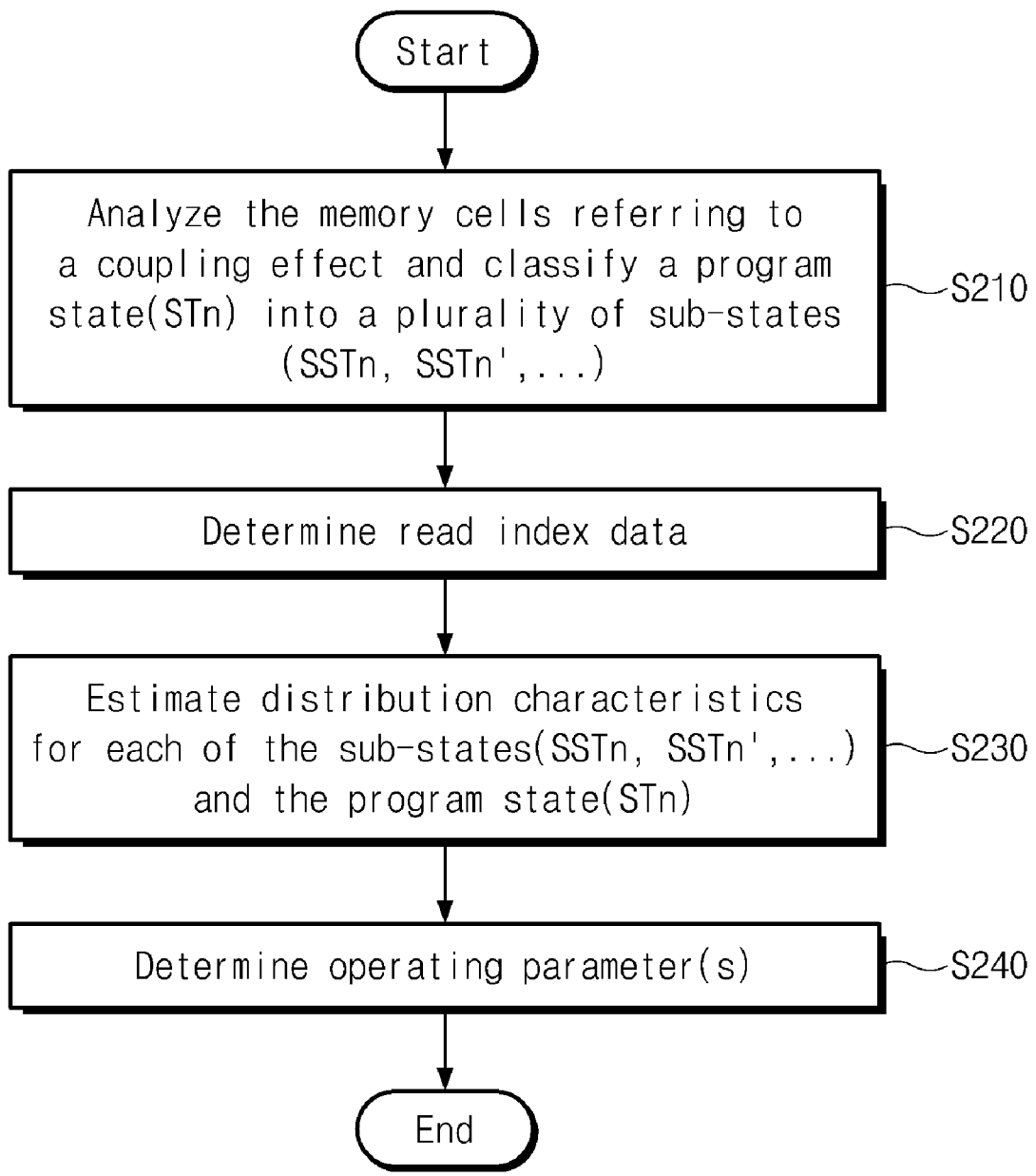
FIG. 8 is a flowchart summarizing a threshold voltage distribution analyzing method according to another embodiment of the inventive concept.

FIG. 8 is a flowchart summarizing a distribution analyzing method according to another embodiment of the inventive concept. Referring to FIG. 8, procedures for characteristics of distributions ST1 and ST2 and sub-distributions SST1, SST2, SST1', and SST2' of a threshold voltage through detection of read index data from memory cells corresponding to sub-distributions, which consider coupling or program disturb, will be described. The illustrated embodiment corresponds to a case where a rough predictive value about sub-distributions is given by separating effects of coupling or program disturb in advance. Hereinafter, the effects of coupling or program disturb will be described with a coupling effect for convenience of description. However, it is apparent that a shift of a threshold voltage is not limited to a coupling effect.

First, a procedure for separating into sub-distributions is performed using a shift parameter (specifically, a coupling parameter). That is, according to effects of coupling or program disturb, one program distribution STn is divided into a plurality of sub-distributions SSTn, SSTn', SSTn", .... Once each general program distribution STn is separated into sub-distributions according to the size of coupling with respect to general program distributions STn, sub-distributions having the same or similar coupling size can be separated. That is, memory cells having the same or similar coupling size can be selected in operation (S210).

Through the separation of sub-distributions according to the coupling size, memory cells having the same or similar coupling size can be selectively accessed. Accordingly, memory cells in the sub-distributions SST1 and SST2 having less coupling effect of FIG. 7 can be selected and read. Through an access for memory cells in the sub-distributions SST1 and SST2, the minimum value L as index data can be detected. Additionally, memory cells in the sub-distributions SST1' and SST2' having a relatively more coupling effect can be selected and read. Through an access for memory cells in the sub-distributions SST1' and SST2', the minimum value L as index data can be detected. If it is guaranteed that each sub-distribution has the same form as the normal distribution, only one of the sub-distributions having the same or similar coupling effect is read to detect the number of memory cells L at the minimum point. However, if this condition is not satisfied and the number of cells having the minimum value with respect to sub-distributions corresponding to a coupling size (which is the separation standard of sub-distributions is detected), more accurate characteristics of sub-distribution can be obtained in operation (S220).

Once index data are detected from the grouped sub-distributions according to the size of coupling or program disturb, distribution characteristics of sub-distributions can be derived by referring to the index data. If distribution characteristics about sub-distributions are provided, it is apparent that characteristics of the distribution including a set of sub-distributions SSTn, SSTn', SSTn", ... can be obtained. The derivation of distribution characteristics about the sub-distributions SSTn, SSTn', SSTn", ... and the distribution STn may be provided through an algorithm for obtaining distribution characteristic using read index data as a parameter. Additionally, characteristic values of general sub-distributions SSTn, SSTn', SSTn", ... and the distribution STn corresponding to the index data can be provided through a table in operation (S230).

Next, by considering characteristics of the sub-distributions SSTn, SSTn', SSTn", ... and the distribution STn, parameter values for driving the actual nonvolatile memory device 220 can be provided. Or, considering characteristics of each derived distribution, various setting values (for example, a DC level and a driving frequency of a nonvolatile memory device), which is provided as a default value, can be corrected in operation (S240).

As mentioned above, with reference to read index data acquired through access of each sub-distribution that is selected by separating effects of coupling or program disturb, characteristics of sub-distributions of memory cells are obtained first. By referring to characteristics of sub-distributions, distribution characteristics of overlapping program states, that is, a set of sub-distributions, can be additionally derived. By referring to characteristics of the analyzed distribution and sub-distributions, a method of providing and adjusting a parameter to control the nonvolatile memory device 220 in an optimized environment was described.

FIG. 9 is a diagram conceptually illustrating another method of obtaining read index data within an analyzing method according to an embodiment of the inventive concept. Referring to FIG. 9, a first memory cell number "A" in an overlapping threshold voltage range of the overlapping first and second threshold voltage distributions ST1 and ST2, and a memory cell number difference value "B" with respect to a second memory cell number "A'" associated with a maximum point voltage, where a highest number of memory cells are dispersed, are obtained as read index data. Additionally, at least one of a first or second threshold voltage difference values (C1 or C2) measured from a base minimum point voltage (Rindex0) to a corresponding first or second maximum point voltage (Rindex1 or Rindex2) corresponding to a maximum point is obtained as read index data. The read index data including A, B, C1, and C2 may be used to estimate threshold voltage form and corresponding operating parameters for the overlapping first and second threshold voltage distributions ST1 and ST2.

When comparing the diagram of FIG. 9(*a*) and the diagram of FIG. 9(*b*), if the overlapping degree of the distributions ST1 and ST2 is great, the difference B between the first and second memory cell numbers (A and a') will be reduced. Additionally, the first and second threshold voltage differences (C1 or C2) will also be reduced. That is, the read index data including A, B, C1, and C2 related to the overlapping first and second threshold voltage distributions is well correlated to the degree of overlap. Accordingly, by providing at least one of A, B, C1, and C2 as part of the read index data, the characteristics (e.g., the size of Ra and Rb) may be accurately estimated. Additionally, as mentioned in the foregoing embodiments, various sub-distributions may be divided from the first and second threshold voltage distributions ST1 and ST2 according to a coupling effect and can be estimated, and distribution characteristics of the overlapping sub-distributions can be additionally obtained.

In the above embodiments, the derivation of the distribution characteristic was described through detection of read index data A, B, C1, and/or C2. However, in order to provide distribution characteristics of a higher resolution, characteristics of overlapping distributions can be obtained by considering read index data including all of A, B, C1, and C2. Or, characteristic estimation of distribution is possible by combining and processing two of the detected index data. For example, a ratio (i.e., A/A') of the minimum value to the maximum value may be provided as read index data.

Additionally, read index data may be provided through processes and combination of various forms. For example, if a number of memory cells detected at an arbitrary threshold voltage of the minimum value and around the minimum value is Nx, index data can be calculated by adding respectively different weighting values to each of the minimum value and the number Nx. That is, the index data are processed in a form of (3×Min+1×Nx).

Especially, in order to separate distribution into a plurality of sub-distributions according to the size of effects (for example, coupling) that shift a threshold voltage, data such as process parameters, coupling, disturb, retention, the number of P/E cycles, and characteristics of pilot cells need to be provided additionally.

As mentioned above, advantages of the present inventive concept are described using a case where one threshold voltage distribution has one maximum value. However, procedures of the present inventive concept may be applied to a case where one threshold voltage distribution has more than two maximum points (or peak values) or minimum points. That is, index data can be provided through the detection of the minimum point at a region where two distributions overlap. Additionally, the maximum value can be provided as the number of memory cells having the highest value among a plurality of peak values. Furthermore, technical features of the present inventive concept are identically applied to the distribution form that does not have a normal distribution form.

Additionally, a read operation for obtaining index data can obtain the minimum values and maximum values by counting the number of flipped bits during a read operation of an interval read method. Accordingly, threshold voltages Rindex0, Rindex1, and Rindex2 of the minimum point or the maximum point correspond to a threshold voltage range, and expressions of the present inventive concept are extreme values that are ideally modeled for convenience of description. Additionally, although a plurality of sub-distributions is divided according to the size of coupling, the sub-distributions may be separated with a higher resolution by applying various shift parameters.

A method of restoring an original form of overlapping distributions according to an analyzing method of the present inventive concept was described. There are various data that can be obtained through an estimated or restored original form. As mentioned above, data retention can be obtained by combining a read voltage having a specific error rate through estimated original distribution form, an optimized read voltage for distinguishing each overlapping distribution, estimation reliability of a specific read voltage, the number of estimated data, estimated data, and the number of P/E cycles. Additionally, this estimated information may be used as information for adjusting an error rate in an Error Correction Code (ECC) operation.

Figure 10:
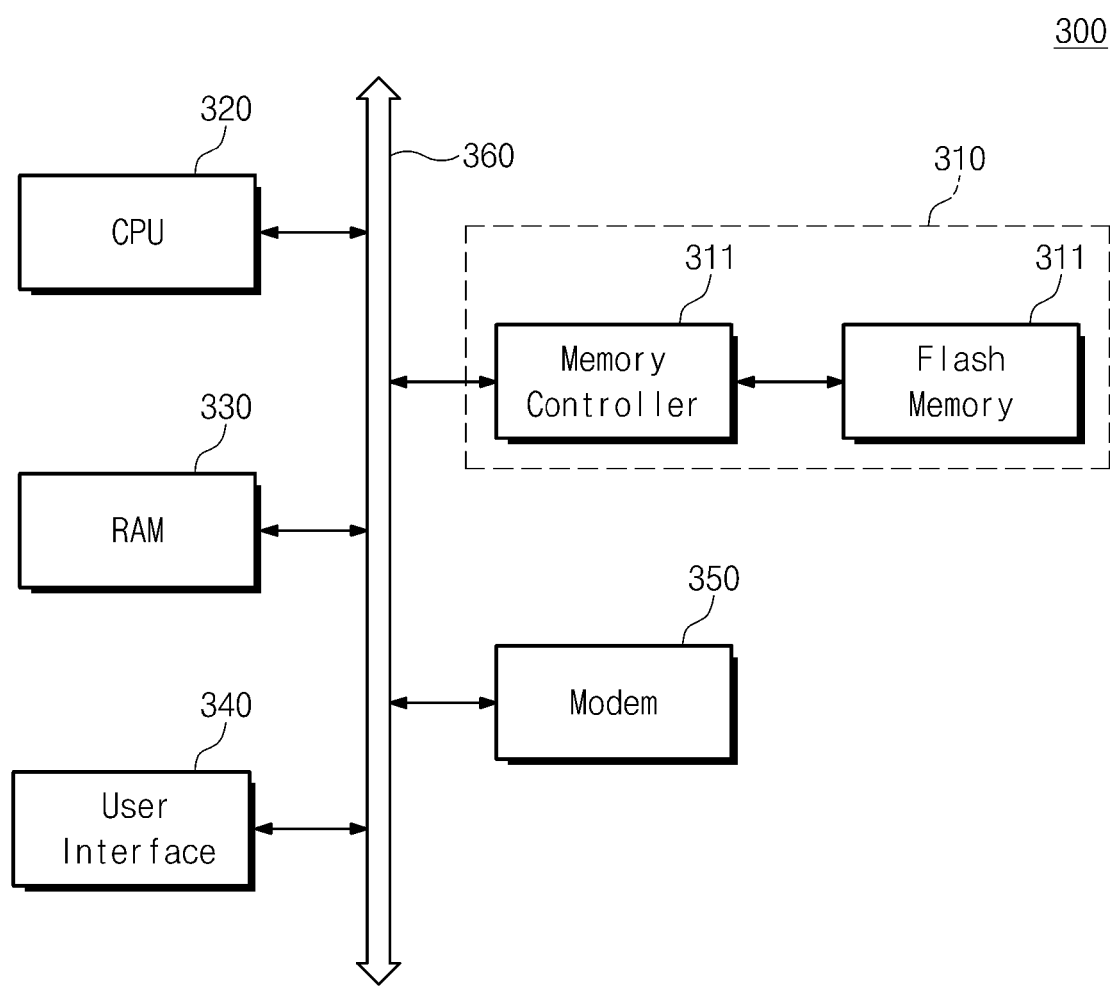
FIG. 10 is a block diagram of the general computational system incorporating a flash memory device according to an embodiment of the inventive concept.

FIG. 10 is a view illustrating a general computational system 300 including a flash memory device 311 according to the present inventive concept. The computational system 300 includes a central processing unit (CPU) 320, a RAM 330, a user interface 340, a modem 350 such as a baseband chipset, and a memory system 310, which are electrically connected to a system bus 360. The memory system 310 substantially has the same configuration as FIG. 2. If the computational system 300 is a mobile device, a battery (not shown) is additionally provided to supply an operation voltage of the computational system 300. Although not illustrated in the drawings, it is apparent to those skilled in the art that the computational system 300 may further include an application chipset, a Cameral Image Processor (CIS), and a mobile DRAM. The memory system 310 may constitute a SSD using a nonvolatile memory to store data. Or, the memory system 310 may be provided as a fusion memory (for example, a one NAND flash memory). The computational system 300 receives highly reliable data from the system 310 through characteristic analysis using obtained index data and distribution separation according to the size of the shift effect of a threshold voltage like coupling. The characteristic analysis of distributions through the index data and distribution separation according to the size of a shift effect of a threshold voltage like coupling can be accomplished by the memory system 310, but also can be accomplished by a control of the CPU 320 of the computational system 300. Or, in order for effective resource utilization, the characteristic analysis of distributions and distribution separation according to the size of a shift effect of a threshold voltage can be accomplished by sharing processes with the memory system 310 and the CPU 320.

The flash memory device and/or the memory controller according to the present inventive concept may be mounted using various forms of packages. For example, the flash memory device and/or the memory controller may be mounted through packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to the inventive concept, through detection of index data (for example, the minimum point and maximum point of threshold voltage distribution and ratio of the maximum point and the minimum point), characteristics of overlapping threshold voltage distribution can be estimated. Accordingly, according to the analyzing method of the inventive concept, a read voltage having a requested arbitrary reliability, reliability estimated from an arbitrary read voltage, and optimized read parameters can be provided.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A distribution analyzing method for a nonvolatile memory device having memory cells exhibiting overlapping first and second threshold voltage distributions, the method comprising:
    detecting a degree of overlap between the first and second threshold voltage distributions by reading data stored in the memory cells and determining read index data from the read data; and
    estimating a distribution characteristic for at least one of the overlapping threshold voltage distributions using the read index data,
    wherein determining the read index data comprises: determining a minimum memory cell number corresponding to a minimum point voltage for an overlapping interval between the first and second threshold voltage distributions; and determining a maximum memory cell number corresponding to a maximum point voltage for one of the first and second threshold voltage distributions, and
    wherein estimating the distribution characteristic for at least one of the first and second threshold voltage distributions comprises: calculating a ratio between the minimum memory cell number and the maximum memory cell number.

2. The method of claim 1, further comprising:
    determining an operating parameter for a read operation executed in relation to the nonvolatile memory device.

3. The method of claim 2, wherein determining the operating parameter comprises defining a read voltage with reference to the estimated distribution characteristic.

4. The method of claim 3, wherein the estimated distribution characteristic is a threshold voltage distribution form.

5. The method of claim 2, wherein the read voltage is defined with reference to a read data error rate.

6. The method of claim 1, wherein detecting the degree of overlap between the first and second threshold voltage distribution comprises:
    dividing the first and second threshold voltage distributions into first and second sub-distributions.

7. The method of claim 6, wherein the first and second threshold voltage distributions are divided into respective first and second sub-distributions with reference to a determined coupling effect.

8. The method of claim 6, wherein the first and second threshold voltage distributions are divided into respective first and second sub-distributions with reference to a determined program disturb.

9. The method of claim 6, further comprising:
    determining an operating parameter for a read operation executed in relation to the nonvolatile memory device.

10. The method of claim 9, wherein determining the operating parameter comprises:
    defining a first read threshold voltage distinguishing between memory cells in the first sub-distribution of the first threshold voltage distribution and the first sub-distribution of the second threshold voltage distribution.

11. A distribution analyzing method for a nonvolatile memory device having memory cells exhibiting overlapping first and second threshold voltage distributions, the method comprising:
    detecting a degree of overlap between the first and second threshold voltage distributions by reading data stored in the memory cells and determining read index data from the read data; and
    estimating a distribution characteristic for at least one of the overlapping threshold voltage distributions using the read index data,
    wherein detecting the degree of overlap between the first and second threshold voltage distribution comprises: dividing the first and second threshold voltage distributions into first and second sub-distributions,
    wherein the method further comprises: determining an operating parameter for a read operation executed in relation to the nonvolatile memory device,
    wherein determining the operating parameter comprises:
    defining a first read threshold voltage distinguishing between memory cells in the first sub-distribution of the first threshold voltage distribution and the first sub-distribution of the second threshold voltage distribution, and
    wherein determining the operating parameter further comprises: defining a second read threshold voltage distinguishing between memory cells in the second sub-distribution of the first threshold voltage distribution and the second sub-distribution of the second threshold voltage distribution.

12. A memory system comprising:
a nonvolatile memory device; and
a memory controller controlling the nonvolatile memory device,
wherein the memory controller controls the nonvolatile memory device through the analyzing method of claim 1.

* * * * *